(12) United States Patent
Morita et al.

(10) Patent No.: US 6,401,734 B1
(45) Date of Patent: Jun. 11, 2002

(54) SUBSTRATE TREATING APPARATUS

(75) Inventors: Fumio Morita; Masataka Fujiki; Hitoshi Oka, all of Tokyo; Noriyuki Oroku, Yokohama; Yuichirou Tanaka, Fujisawa, all of (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 09/524,744

(22) Filed: Mar. 13, 2000

(30) Foreign Application Priority Data

Mar. 11, 1999 (JP) .......................................... 11-064574

(51) Int. Cl.[7] .............................................. B08B 3/02
(52) U.S. Cl. ........................ 134/153; 134/157; 134/158; 134/159; 134/902
(58) Field of Search ............................... 134/94.1, 116, 134/137, 140, 141, 144, 145, 147, 149, 151, 153, 154, 157, 158, 159, 902

(56) References Cited

U.S. PATENT DOCUMENTS

| 4,774,883 A | | 10/1988 | Mailander .................... 101/137 |
| 5,211,753 A | * | 5/1993 | Swain .......................... 118/52 |
| 5,706,843 A | * | 1/1998 | Matsuo ......................... 108/22 |
| 6,062,239 A | * | 5/2000 | Bexten ......................... 134/148 |
| 6,105,592 A | * | 8/2000 | Thompson et al. .......... 134/105 |
| 6,149,727 A | * | 10/2000 | Yoshioka et al. ............ 118/500 |

FOREIGN PATENT DOCUMENTS

| JP | 54-073475 | * | 6/1979 |
| JP | 61-179741 U | | 11/1986 |
| JP | 04-369210 | | 12/1992 |
| JP | 08-130202 | * | 5/1996 |
| JP | 09-129587 | * | 5/1997 |
| WO | 99/20407 | * | 4/1999 |

* cited by examiner

*Primary Examiner*—Randy Gulakowski
*Assistant Examiner*—Joseph Perrin
(74) *Attorney, Agent, or Firm*—McGinn & Gibb, PLLC

(57) ABSTRACT

A substrate treating apparatus and method can recover a substrate treating liquid such as a cleaning liquid in an efficient manner and positively avoid occurrences of treatment defects such as formation of cleaning spots, water marks and the like. A fixed upper plate and a fixed lower plate are disposed in opposition to each other so as to define a space therebetween. A substrate such as a semiconductor wafer is inserted into the space between the fixed upper and lower plates, supported there by a support and adapted to be rotated through rotation of the support. A substrate treating medium such as a cleaning liquid is introduced into the space to treat the substrate while the substrate is rotating. The treating medium after having treated the substrate is discharged from the space through a discharge passage which is defined between an outer peripheral surface of the support and an inner surface of a housing which covers the outer peripheral surface of the support. Rotary blades are disposed in the discharge passage and adapted to rotate in accordance with the rotation of the substrate, thereby enhancing discharging of the substrate treating medium from the space through the discharge passage.

19 Claims, 2 Drawing Sheets

SUBSTRATE TREATING APPARATUS

BACKGROUND OF THE INVENTION

1. Field of the Invention

The present invention relates to a substrate treating apparatus and method (for example, a sheet-feed type substrate cleaning apparatus for cleaning a plurality of wafers fed sheet by sheet) having a recovery system for a substrate treating medium such as a substrate cleaning liquid or the like. More specifically, it relates to a technology for improving a recovery rate of the substrate treating medium.

2. Description of the Related Art

Conventionally, a substrate treating or processing apparatus having a system for cleaning substrates such as silicon wafers by means of a cleaning liquid and recovering the same has been known, an example of which is described in Japanese Patent Laid-Open No. Hei 8-130202.

The substrate treating apparatus includes, as a wafer cleaning system (Bernoulli cleaning mechanism), an upper cleaning plate disposed in opposition to an upper surface of a wafer, a lower cleaning plate disposed in opposition to a lower surface of the wafer, and a wafer holder of a cylindrical configuration having an inner diameter equal to an outer diameter of the wafer. The wafer is held in a horizontal state thereof by the wafer holder with its outer periphery being in contact with an inner peripheral surface of the wafer holder. The upper and lower cleaning plates are disposed in parallel with the upper and lower surfaces, respectively, of the wafer for ejecting a cleaning liquid thereto, whereupon the wafer holder is driven to rotate, thus causing the wafer held thereby to rotate.

A portion of the cleaning liquid ejected from the center of the upper cleaning plate passes through a space defined between the upper cleaning plate and the wafer to flow out from between the outer periphery of the upper cleaning plate and the outer periphery of the wafer upper surface, whereas another portion of the cleaning liquid ejected from the center of the lower cleaning plate passes through a space defined between the lower cleaning plate and the wafer to flow out from the outer periphery of the lower cleaning plate and the outer periphery of the wafer lower surface.

With the above-mentioned substrate treating apparatus, a mechanism is required for preventing the cleaning liquid flowing out of the outer peripheries of the wafer upper and lower surfaces from splashing or scattering into the surroundings, as described above. To this end, for example, it may be beneficial to provide a cover for covering the whole of the upper and lower cleaning plates and the wafer holder.

In practice, however, such a cover is required to have, in addition to the function of merely preventing the splashing or scattering of the cleaning liquid, further functions of recovering the used cleaning liquid in an efficient manner and preventing those portions of the cleaning liquid which are left attached as liquid mists or droplets to the wafer holder, the cover and the like after cleaning from being again attached to the wafer that has been cleaned. If the cleaning liquid is attached to the once cleaned wafer, it would cause formation of cleaning spots, water marks and the like.

SUMMARY OF THE INVENTION

In view of the above, the present invention is intended to obviate the above-mentioned problems encountered with the conventional apparatus and has for its object to provide a substrate treating apparatus and method which are capable of recovering a substrate treating medium such as a cleaning liquid in an efficient manner and which can positively avoid occurrences of treatment defects such as formation of cleaning spots, water marks and the like.

Bearing the above object in mind, according to a first aspect of the present invention, there is provided a substrate treating apparatus comprising: a fixed upper plate; a fixed lower plate disposed in opposition to the fixed upper plate; a mechanism for supporting a substrate at a location in a space defined between the fixed upper and lower plates, rotating the substrate and introducing a substrate treating medium (e.g., a cleaning liquid) into the space to treat the substrate while the substrate is rotating: a discharge passage through which the substrate treating medium is discharged from the space; and rotary blades disposed in the discharge passage and adapted to rotate in accordance with the rotation of the substrate, thereby enhancing discharging of the substrate treating medium from the space through the discharge passage.

With this construction, the rotary blades disposed in the discharge passage draw the substrate treating medium in a direction to discharge it, thus improving the discharging of the substrate treating medium.

According to a second aspect of the present invention, there is provided a substrate treating apparatus comprising: a fixed upper plate; a fixed lower plate disposed in opposition to the fixed upper plate; a support for supporting a substrate at a location in a space defined between the fixed upper and lower plates, the support being rotatable and having an outer peripheral surface (e.g., an outer peripheral surface of an outer ring); a housing having an inner surface and covering the outer peripheral surface of the support; a drive mechanism for rotating the support together with the substrate and introducing a substrate treating medium into the space to treat the substrate while the substrate is rotating; a discharge passage defined between the outer peripheral surface of the support and the inner surface of the housing for discharging the substrate treating medium from the space; first vanes (e.g., rotary blades) provided on the outer peripheral surface of the support for enhancing discharging of the substrate treating medium from the space through the discharge passage; and second vanes (e.g., stationary blades) provided on the inner surface of the housing for enhancing, in cooperation with the first vanes, the discharging of the substrate treating medium from the space through the discharge passage.

In a preferred mode of the second aspect of the invention, the second vanes (e.g., stationary blades) are disposed at locations downstream of the first vanes (e.g., rotary blades) in a direction in which the substrate treating medium is to be discharged.

In another preferred mode of the second aspect of the invention, the first vanes (e.g., rotary blades) and/or the second vanes (e.g., stationary blades) are inclined so as to guide the substrate treating medium in a direction to discharge it.

In a further preferred mode of the second aspect of the invention, the first vanes (e.g., rotary blades) and the second vanes (e.g., stationary blades) are inclined in opposite directions with respect to each other.

In a still further preferred mode of the second aspect of the invention, the first vanes (e.g., rotary blades) and the second vanes (e.g., stationary blades) are inclined in opposite directions with respect to each other at an angle of 45 degrees with respect to the discharging direction.

In a yet further preferred mode of the second aspect of the invention, the support (e.g., substrate chuck pins of a substrate support) serves to support the substrate at its upper end, and each of the first vanes (e.g., rotary blades) has an upper end thereof positioned at a location higher than an upper surface of the substrate.

In a further preferred mode of the second aspect of the invention, the first vanes provided on the outer peripheral surface of the support is rotatable in unison with the support.

In a further preferred mode of the second aspect of the invention, the second vanes are fixedly secured to the inner surface of the housing.

In a further preferred mode of the second aspect of the invention, the second vanes provided on the inner surface of the housing are rotatable in a direction opposite the direction in which the first vanes rotate.

In a further preferred mode of the second aspect of the invention, the first vanes provided on the outer peripheral surface of the support rotate at a speed higher than that of the support.

In a further preferred mode of the second aspect of the invention, third vanes (e.g., threaded screws) are provided on the outer peripheral surface of the support on which the first vanes are provided.

In a further preferred mode of the second aspect of the invention, the third vanes (e.g., threaded screws) are disposed at locations downstream of the first vanes (e.g., rotary blades) and the second vanes (e.g., stationary blades) in a direction in which the substrate treating medium is to be discharged.

In a further preferred mode of the second aspect of the invention, a plurality of sets of assemblies are provided each of which comprises the first vanes, the second vanes and the third vanes, the sets of assemblies being disposed in the discharging direction.

According to a third aspect of the present invention, there is provided a substrate treating method comprising: inserting a substrate into a space defined between a fixed upper plate and a fixed lower plate; introducing a substrate treating medium into the space; rotating the substrate in the space; rotating rotary blades in a discharge passage, through which the substrate treating medium is to be discharged, in accordance with the rotation of the substrate; and discharging the substrate treating medium from the space through the discharge passage under a discharging action of the rotary blades.

According to a fourth aspect of the present invention, there is provided a substrate treating method comprising: inserting a substrate into a space defined between a fixed upper plate and a fixed lower plate; introducing a substrate treating medium into the space; rotating the substrate through a support which supports the substrate; discharging the substrate treating medium from the space through a discharge passage defined between an outer peripheral surface of the support and an inner surface of a housing which covers the outer peripheral surface of the support; and discharging, during the discharging of the substrate treating medium, the substrate treating medium through cooperation of first vanes provided on the outer peripheral surface of the support for enhancing a discharging operation of the discharge passage and second vanes provided on the inner surface of the housing for enhancing the discharging of the substrate treating medium.

In a preferred mode of the fourth aspect of the invention, the second vanes are disposed at locations downstream of the first vanes in a direction in which the substrate treating medium is to be discharged.

In another preferred mode of the fourth aspect of the invention, the first vanes and/or the second vanes are inclined so as to guide the substrate treating medium in the discharging direction.

In a further preferred mode of the fourth aspect of the invention, the first and second vanes are inclined in opposite directions with respect to each other.

According to the substrate treating method of the invention as described above, the rotary blades disposed in the discharge passage draw the substrate treating medium in a direction to discharge it, thus improving the discharging of the substrate treating medium and permitting the substrate treating medium such as a cleaning liquid to be recovered efficiently.

The above and other objects, features and advantages of the present invention will become more readily apparent to the those skilled in the art from the following detailed description of a preferred embodiment of the invention taken in conjunction with the accompanying drawings.

DESCRIPTION OF THE PREFERRED EMBODIMENT

Now, a presently preferred embodiment of the invention will be described in detail while referring to the accompanying drawings. In the following description, the present invention is applied, by way of an example, to a sheet-feed type substrate treating apparatus having a substrate cleaning system.

Figure 1:
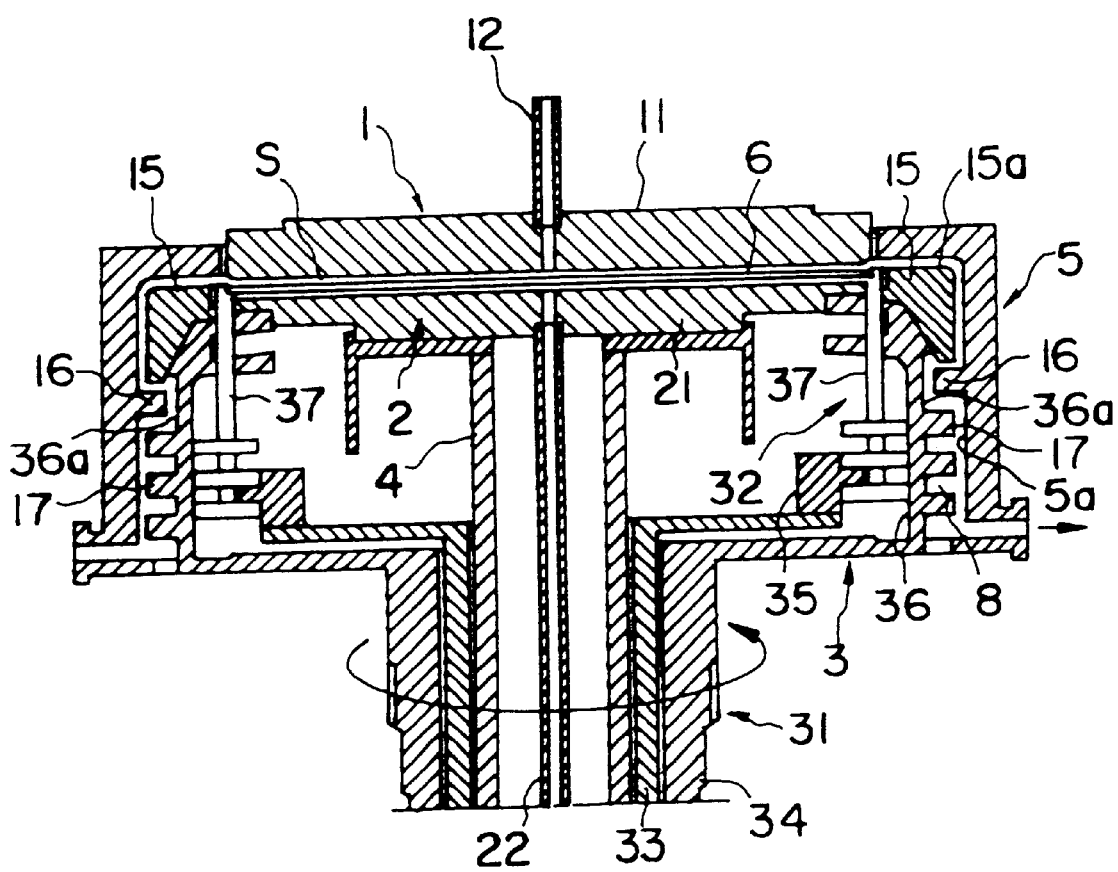
FIG. 1 is a cross sectional side view showing an embodiment of the present invention.
Figure 2:
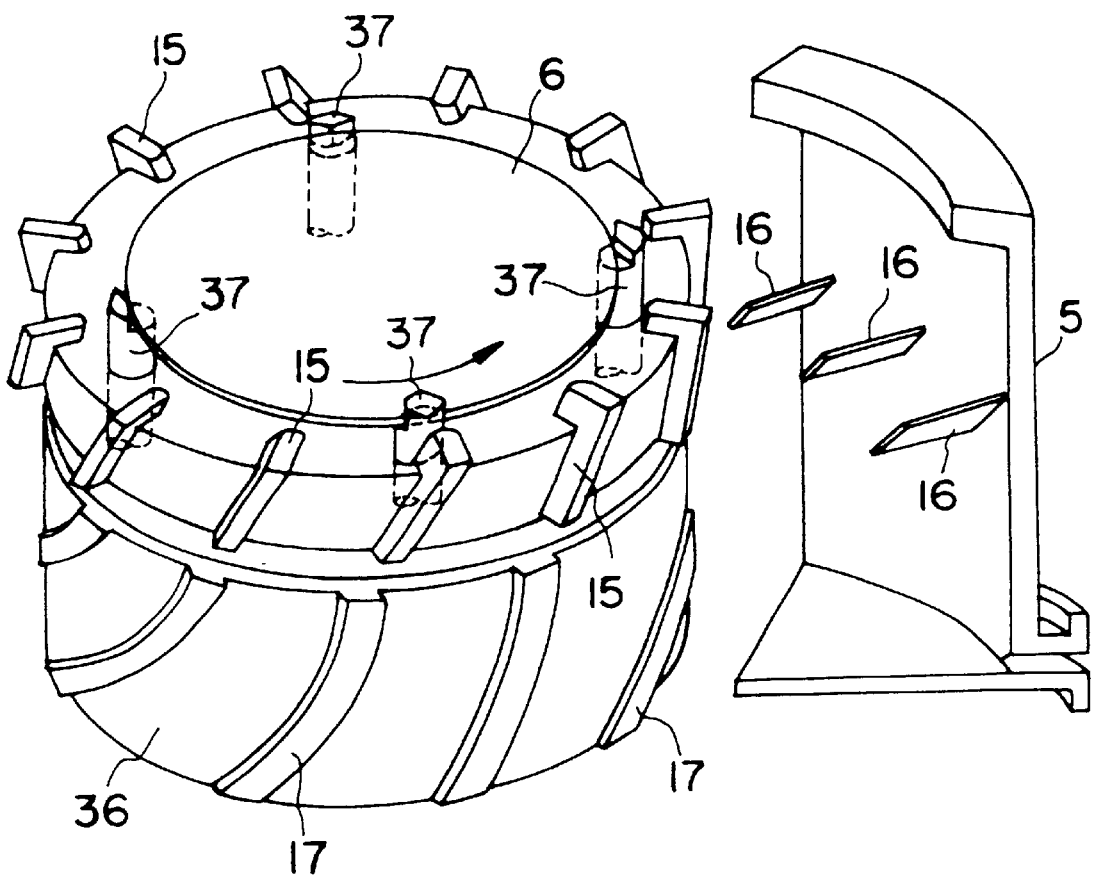
FIG. 2 is a perspective view showing a positional relation between rotary blades, stationary blades and threaded screws.

FIG. 1 shows, in partial cross section, essential portions of the substrate cleaning system of the substrate treating apparatus of the invention, and FIG. 2 shows, in a perspective view, a relation between an outer ring and a housing.

In FIG. 1. the substrate cleaning system of the present invention includes a fixed upper plate 1 disposed in a horizontal state, a fixed lower plate 2 disposed under the fixed upper plate 1 in a horizontal state in opposition to the fixed upper plate 1, a rotating side portion 3 being rotatable while supporting a substrate 6 in a horizontal manner between the fixed upper plate 1 and the fixed lower plate 2, a support shaft 4 for rotatably supporting the rotating side portion 3 in the center thereof and firmly supporting the fixed lower plate 2 at an upper end thereof, and a housing 5 extending or hanging down from the periphery edge of the fixed upper plate 1.

The fixed upper plate 1 has an upper Bernoulli plate 11 of a circular shape, and a treating medium introducing pipe 12 provided on the center of the upper Bernoulli plate 11 from above. The fixed upper plate 1 is caused to move up and down in a vertical direction by means of an unillustrated vertical drive mechanism so as to open and close, i.e., move toward and away from the fixed lower plate 2, for the purpose of loading or unloading a substrate 6 such as a semiconductor wafer or the like. The upper Bernoulli plate 11 has its lower surface configured into a circular flat surface having a diameter substantially equal to that of the substrate 6, and it is supported in a horizontal manner with its lower surface directed downward in a vertical direction. The treating medium introducing pipe 12 supplies a substrate treating medium such as a cleaning liquid for treating or cleaning the substrate 6 through an unillustrated valve.

The fixed lower plate 2 has a lower Bernoulli plate 21 of a circular shape, and a treating medium introducing pipe 22 provided in the center thereof from below. The lower Bernoulli plate 21 has its upper surface configured into a circular flat surface having a diameter substantially equal to that of the substrate 6, and it is fixedly supported on an upper end of the support shaft 4 in a horizontal manner so as to confront with the lower surface of the upper Bernoulli plate 11 with a space formed therebetween.

The rotating side portion 3 has a cylindrical support member 31 rotatably mounted on the support shaft 4, and a substrate support member 32 formed at an upper end of the cylindrical support member 31 for supporting the substrate 6 at its upper peripheral edge. The cylindrical support member 31 takes the shape of a double cylindrical configuration comprising an inner cylinder 33 and an outer cylinder 34, each of which has an upper end extending radially outward to form a flange-shaped configuration so that the substrate support member 32 is provided vertically in an upright posture in the most-outer peripheral portions of the flanged upper ends of the inner and outer cylinders.

The substrate support member 32 comprises a plurality of substrate chucking pins 37 disposed on a circle between an inner ring 35 and an outer ring 36, the inner ring 35 being provided at the peripheral edge of the inner cylinder 33 of the cylindrical support 31 extending from the upper end thereof to form a flange-shaped configuration, and an outer ring 36 being provided upright on the peripheral edge of the outer cylinder 34 of the cylindrical support 31 extending from the upper end thereof to form a flange-shaped configuration. The substrate chucking pins 37 serve to grip at their upper ends the circumferential portion of the substrate 6 at its plural locations. In this connection, it is to be noted that the inner and outer rings 35, 36 are driven to rotate relative to each other by means of an unillustrated rotating drive mechanism, whereby the substrate chucking pins 37 are caused to rotate a predetermined angle with the outer ring 36 being held stationary under the action of an unillustrated drive system, thus gripping and releasing the circumferential peripheral portion of the substrate 6. When a substrate 6 is loaded into and unloaded from the substrate treating apparatus, the inner ring 35 and the substrate chucking pins 37 are driven to move in a vertical direction by means of an unillustrated vertical drive mechanism.

The housing 5 has a cylindrical portion hanging down from the outer periphery of the fixed upper plate 1 in an eaves-like manner to cover or surround the outer peripheral side surface 36a of the outer ring 36 of the rotating side portion 3. An inner surface 5a of the housing 5 and the outer peripheral side surface 36a of the outer ring 36 cooperate to define an annular space therebetween, which serves as a discharge passage 8 for the substrate treating medium in the form of a cleaning liquid. As can be clearly seen from FIG. 1, the discharge passage 8 has an upstream side near the upper end of the outer ring 36 of the rotating side portion 3, and a downstream side near the lower end of the outer ring 36.

With the above construction, as shown in FIGS. 1 and 2, a plurality of rotary blades 15 (serving as first vanes) and a plurality of threaded screws 17 (serving as third vanes) are fixedly secured to the outer peripheral side surface 36a of the outer ring 36 of the rotating side portion 3 at its upper and lower parts, respectively. On the other hand, a plurality of stationary blades 16 (serving as second vanes) are fixedly provided on the inner surface 5a of the housing 5 confronting with the outer peripheral side surface 36a of the outer ring 36, such that they are presented at locations between the rotary blades 15 and the threaded screws 17.

Figure 3:
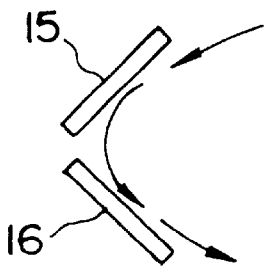
FIG. 3 is a view explaining a cooperative operation between the rotary blades and the stationary blades.

Specifically, the stationary blades 16 are disposed at locations downstream of the rotary blades 15 in a direction in which the substrate treating medium is to be discharged, and the threaded screws 17 are disposed at locations downstream of the rotary blades 15 and the stationary blades 16 in a. direction in which the substrate treating medium is to be discharged. Also, as illustrated in FIG. 3, the rotary blades 15 and the stationary blades 16 are mutually arranged in an inclined manner so as to effectively guide the substrate treating medium in a direction to discharge it, that is they are inclined in mutually opposite directions at an angle of 45 degrees with respect to the direction in which the substrate treating medium is to be discharged. Moreover, the upper ends 15a of the rotary blades 15 are disposed substantially flush with the upper end of the outer ring 36, and hence at a position higher than the upper surface of the substrate 6 supported by the substrate support member 32.

Next, the operation of the above-described embodiment will be described below in detail.

Upon loading or introducing a substrate 6 into the substrate treating apparatus, the upper Bernoulli plate 11 is driven to move in an upward direction to an appropriate upper position by means of the unillustrated vertical drive mechanism, and the substrate 6 is transported to a prescribed position by means of an unillustrated robot arm, which is then stopped there. At this time, the substrate chucking pins 37 are caused to move upward to grip the substrate 6, and the robot arm is then moved back or receded, allowing the substrate chucking pins 37 holding the substrate 6 to move down. Subsequently, the upper Bernoulli plate 11 is lowered to a prescribed position so as to define a space S between itself and the lower Bernoulli plate 21, as shown in FIG. 1.

Then, the substrate support member 32 is rotated to start rotation of the substrate 6, and simultaneous with this, a cleaning liquid pressure fed from an unillustrated cleaning liquid supply to the upper and lower introduction pipes 12, 22 is ejected onto the upper and lower surfaces of the substrate 6 through the introduction pipes 12, 22, thus initiating the cleaning operation. The cleaning liquid ejected to the center of the substrate 6 is splashed or scattered out of the outer periphery of the substrate 6 toward the discharge passage 8 under the combined action of a nozzle or jetting operation and a centrifugal force. At this time, the cleaning liquid thus scattered can be collected or recovered efficiently into a single site or spot by means of the housing 5 provided outwardly of the substrate support member 32. In addition, the rotary blades 15 and the threaded screws 17, which are rotating as the substrate 6 rotates, act to change the direction of the scattered cleaning liquid to a lower portion of the discharge passage 8, thus guiding it into a downstream side of the discharge passage 8. Also, the stationary blades 16 provided on the housing 5 cooperate with the rotary blades 15 and the threaded screws 17 so as to enhance a discharging operation for the used cleaning liquid. That is, the discharge passage 8 is connected to a vacuum pump (not shown) so that a vacuum or suction force of the pump acts to increase the cleaning liquid discharging operation in combination with a pressure reducing effect produced by the action of a turbo pumping principle of the rotary blades 15, stationary blades 16 and threaded screws 17.

According to the aforementioned conventional substrate cleaning system, since the edge portions of a substrate are supported by a chuck mechanism or substrate support, it is impossible to cover the substrate with a pair of upper and lower Bernoulli plates in a complete manner. For this reason, a cleaning liquid is caused to generate a scroll in the surroundings of the substrate, thus preventing smooth discharging of the cleaning liquid. In contrast to this, according to the present invention, under the action of the rotary blades and the like, there is created a forced down flow of air, i.e., an air stream flowing in a direction to discharge the cleaning liquid, so that the cleaning liquid around the substrate is forced to be discharged, thus preventing droplets or mists of the cleaning liquid, which would otherwise remain in the surroundings of the substrate, from being attached to the substrate after having being cleaned. This serves to effectively avoid any possible contamination of the cleaned substrate. Moreover, the substrate treating apparatus of the invention can be constructed such that oxygen can be blocked from being supplied to the space S formed between the upper and lower Bernoulli plates 11, 21, thereby providing an additional advantage of suppressing formation of naturally oxidized films on the surfaces of the substrate.

Still further, in cases where substrates are to be subjected to a series of treatments such as transportation, cleaning or other treatments such as a CVD treatment and the like without being contacted by ambient air, the apparatus is required to be constructed such that respective components thereof be connected or associated with each other in a non-air atmosphere that contains no air, or in a pressure-reduced or negative-pressure atmosphere, and a cleaning system capable of completely removing a used cleaning liquid is also required for the purpose of preventing the cleaning liquid from being attached to a transportation device and the like and thus resulting in a cause of corrosion for a transportation arm, etc. In contrast, however, according to the apparatus of the present invention as described above, such a system or construction can be realized and provided without difficulty.

Though a single embodiment of the present invention has been described in the foregoing, the present invention is never limited to such an embodiment, but may be subject to various applications, changes or modifications.

For example, if the stationary blades 16, which serves as second vanes, provided on the inner surface of the housing 5, is constructed to be rotatable in a direction opposite the direction in which the rotary blades 15, serving as first vanes, rotates, it will be possible to further enhance the pressure reducing effect created by the turbo-pumping principle as referred to above, thus increasing the discharging of the used cleaning liquid. Further, with regard to the rotation of the stationary blades, the housing having the stationary blades mounted thereon may be rotated or alternatively a rotating drive mechanism for directly rotating the stationary blades may be provided within the housing.

Moreover, although in the above-described embodiment, the rotary blades 15 are rotatable in unison with the substrate support member 32, it may be constructed such that the rotary blades rotate at a speed greater than that of the substrate support member 32. In addition, there may be the case where the rotating speed of a substrate is limited by the contents of treatments to be applied thereto, but in such a case, the greater the substrate's rotating speed, the greater becomes the suction or discharging effect, thus adding to the advantage of the invention.

Furthermore, although in the above embodiment, reference has been made to a case in which the rotary blades 15 (first vanes), the stationary blades 16 (second vanes) and the threaded screws 17 (third vanes) are assembled together, a combination of the rotary blades 15 (first vanes) and the stationary blades (second vanes) alone can provide a satisfactory discharging effect.

Still more, although in the above embodiment, there has been employed a single set or stage of assembly comprising the rotary blades 15 (first vanes), the stationary blades 16 (second vanes) and the threaded screws 17 (third vanes), a plurality of sets or stages of assemblies each comprising the same components may be used for further improving the cleaning liquid discharging effect.

As can be seen from the foregoing description, according to the present invention, rotary blades are provided in a discharge passage for a substrate treating medium in order to improve a discharging operation for the treating liquid. With the provision of such rotary blades, it is possible to provide a substrate treating apparatus and a substrate treating method in which the substrate treating medium such as a cleaning liquid can be recovered in an effective manner, thereby preventing the used treating medium from being attached to a substrate that has been cleaned, and thus creating resultant treatment defects such as, for example, cleaning spots, water marks, etc., on surfaces of the substrate.

What is claimed is:

1. A substrate treating apparatus comprising:

a fixed upper plate;

a fixed lower plate disposed in opposition to said fixed upper plate;

a mechanism for supporting a substrate at a location in a space defined between said fixed upper and lower plates, rotating said substrate and introducing a substrate treating medium into said space to treat said substrate while said substrate is rotating;

a discharge passage through which said substrate treating medium is discharged from said space; and rotary blades disposed in said discharge passage and adapted to rotate in accordance. with the rotation of said substrate, thereby enhancing discharging of said substrate treating medium from said space through said discharge passage, wherein said rotary blades are inclined relative to a direction of movement about an axis of rotation of said substrate treating apparatus.

2. A substrate treating apparatus comprising:

a fixed upper plate;

a fixed lower plate disposed in opposition to said fixed upper plate;

a support for supporting a substrate at a location in a space defined between said fixed upper and lower plates, said support being rotatable and having an outer peripheral surface;

a housing having an inner surface and covering the outer peripheral surface of said support;

a drive mechanism for rotating said support together with said substrate and introducing a substrate treating medium into said space to treat said substrate while said substrate is rotating;

a discharge passage defined between the outer peripheral surface of said support and the inner surface of said housing for discharging said substrate treating medium from said space;

first vanes provided on the outer peripheral surface of said support for enhancing discharging of said substrate treating medium from said space through said discharge passage; and second vanes provided on the inner surface of said housing for enhancing, in cooperation with said first vanes, the discharging of said substrate treating medium from said space through said discharge passage.

3. The substrate treating apparatus as set forth in claim 2, wherein said second vanes are disposed at locations downstream of said first vanes in a direction in which said substrate treating medium is to be discharged.

4. The substrate treating apparatus, as set forth in claim 2, wherein said at least one of said first vanes and said second vanes is inclined so as to guide said substrate treating medium in a direction to discharge it.

5. The substrate treating apparatus as set forth in claim 4, wherein said first vanes and said second vanes are inclined in opposite directions with respect to each other.

6. The substrate treating apparatus as set forth in claim 5, wherein said first vanes and said second vanes are inclined in opposite directions with respect to each other at an angle of 45 degrees with respect to the discharging direction.

7. The substrate treating apparatus as set forth in claim 2, wherein said support serves to support said substrate at its upper end, and each of said first vanes has an upper end thereof positioned at a location higher than an upper surface of said substrate.

8. The substrate treating apparatus as set forth in claim 2, wherein said first vanes provided on the outer peripheral surface of said support is rotatable in unison with said support.

9. The substrate treating apparatus as set forth in claim 2, wherein said second vanes are fixedly secured to the inner surface of said housing.

10. The substrate treating apparatus as set forth in claim 2, wherein said second vanes provided on the inner surface of said housing are rotatable in a direction opposite the direction in which said first vanes rotate.

11. The substrate treating apparatus as set forth in claim 2, wherein said first vanes provided on the outer peripheral surface of said support rotate at a speed higher than that of said support.

12. The substrate treating apparatus as set forth in claim 2, further comprising third vanes provided on the outer peripheral surface of said support on which said first vanes are provided.

13. The substrate treating apparatus as set forth in claim 2, wherein said third vanes are disposed at locations downstream of said first and second vanes in a direction in which said substrate treating medium is to be discharged.

14. The substrate treating apparatus as set forth in claim 11, further comprising a plurality of sets of assemblies each comprising said first vanes, said second vanes and said third vanes, said sets of assemblies being disposed in the discharging direction.

15. The substrate treating apparatus, as set forth in claim 2, wherein at least one of said first and second vanes are inclined relative to a direction of discharge of said substrate treating medium.

16. The substrate treating apparatus, as set forth in claim 1, further comprising:

a housing having an inner surface and enclosing an outer peripheral surface between said fixed upper plate and said fixed lower plate.

17. The substrate treating apparatus, as set forth in claim 16, wherein said discharge passage comprises a space between said outer peripheral surface and said inner surface of said housing.

18. The substrate treating apparatus, as set forth in claim 1, further comprising:

fixed blades disposed in said discharge passage at a position downstream from said rotary blades.

19. A substrate treating apparatus comprising:

a fixed upper plate;

a fixed lower plate disposed in opposition to said fixed upper plate;

a mechanism for supporting a substrate at a location in a space defined between said fixed upper and lower plates, rotating said substrate and introducing a substrate treating medium into said space to treat said substrate while said substrate is rotating;

a discharge passage through which said substrate treating medium is discharged from said space; and rotary blades disposed in said discharge passage and adapted to rotate in accordance with the rotation of said substrate, thereby enhancing discharging of said substrate treating medium from said space through said discharge passage, wherein said rotary blades are inclined relative to a direction of discharge of said substrate treating medium which is a vertical direction.

* * * * *

UNITED STATES PATENT AND TRADEMARK OFFICE
CERTIFICATE OF CORRECTION

PATENT NO.    : 6,401,734 B1
DATED         : June 11, 2002
INVENTOR(S)   : Morita et al.

It is certified that error appears in the above-identified patent and that said Letters Patent is hereby corrected as shown below:

<u>Title page,</u>
Item [73], should read as follows:
-- [73] Assignee: Hitachi Kokusai Electric Inc., Tokyo (JP); and
                  Hitachi Ltd., Tokyo, (JP) --.

Signed and Sealed this

Twenty-ninth Day of October, 2002

Attest:

Attesting Officer

JAMES E. ROGAN
*Director of the United States Patent and Trademark Office*